(12) United States Patent
Lee

(10) Patent No.: US 7,667,521 B2
(45) Date of Patent: Feb. 23, 2010

(54) VOLTAGE SWITCH CIRCUIT OF SEMICONDUCTOR DEVICE

(75) Inventor: Yong Seop Lee, Cheongju-si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 0 days.

(21) Appl. No.: 12/122,373

(22) Filed: May 16, 2008

(65) Prior Publication Data

US 2008/0284492 A1  Nov. 20, 2008

(30) Foreign Application Priority Data

May 16, 2007  (KR)  ............... 10-2007-0047540

(51) Int. Cl.
*H03L 5/00* (2006.01)
(52) U.S. Cl. .............. 327/333; 326/80; 365/189.11
(58) Field of Classification Search ............ 327/108, 327/109, 112, 390, 333, 423, 424, 427, 536; 326/80, 81, 83, 88; 365/189.11
See application file for complete search history.

(56) References Cited

U.S. PATENT DOCUMENTS

| 7,038,492 | B2 * | 5/2006 | Wu et al. ............ 326/81 |
| 7,157,957 | B2 * | 1/2007 | Kim .................. 327/390 |
| 7,362,158 | B2 * | 4/2008 | Park et al. ........... 327/333 |
| 7,463,065 | B1 * | 12/2008 | Lin et al. ............ 326/68 |

\* cited by examiner

*Primary Examiner*—Long Nguyen
*Assistant Examiner*—Shikha Goyal
(74) *Attorney, Agent, or Firm*—Saliwanchik, Lloyd & Saliwanchik

(57) ABSTRACT

Disclosed is a voltage switch circuit of a semiconductor device. The subject voltage switch circuit can be used to apply voltage to a semiconductor memory device control circuit. The voltage switch circuit according to an embodiment includes five transistors and a capacitor. An output terminal of the subject circuit outputs VSS when VDD is applied to an input terminal, and outputs a boosted operating voltage when VSS is applied to the input terminal.

15 Claims, 5 Drawing Sheets

| mode | CG | TG | RBL |
|---|---|---|---|
| writing | 12V | 0V | 0V |
| erasing | 0V | 12V | 0V |
| reading | 3.3V | 0V | 2V |

US 7,667,521 B2

VOLTAGE SWITCH CIRCUIT OF SEMICONDUCTOR DEVICE

CROSS-REFERENCE TO RELATED APPLICATION

The present application claims the benefit under 35 U.S.C. §119 of Korean Patent Application No. 10-2007-0047540, filed May 16, 2007, which is hereby incorporated by reference in its entirety.

BACKGROUND

Recently, semiconductor memory devices are being extensively used. For example, one representative semiconductor memory device is an EEPROM (electrically erasable programmable read-only memory) capable of writing, reading and erasing data by applying differentiated control voltage.

FIG. 1 is a circuit diagram schematically illustrating elements of a semiconductor device control circuit, and FIG. 2 is a data table illustrating voltage for each applied mode for controlling the semiconductor device.

Referring to FIG. 1, a semiconductor memory device, i.e. an EEPROM 10, has three voltage control terminals CG. RBL and TG for data writing, reading and erasing operations. The voltage control terminal TG connects to a first transistor 20, the voltage control terminal RBL connects to a second transistor 30, and the voltage control terminal CG connects to a third transistor 40.

The transistors 20, 30 and 40 are typically NMOS (n-channel metal oxide semiconductors) transistors, and selectively transfer an external signal to the semiconductor memory device 10 in order to perform writing, reading and erasing operations.

Control terminals (e.g. gates) of the transistors 20, 30 and 40 are connected with a first external terminal 50 to receive an operating voltage. The first transistor 20 connected with the voltage control terminal TG of the EEPROM 10 is also connected to a second external terminal 60.

Further, the second transistor 30 connected with the voltage control terminal RBL of the EEPROM 10 is also connected to a third external terminal 70, and the third transistor 40 connected with the voltage control terminal CG is also connected to a fourth external terminal 80.

As shown in FIG. 2, in order to write data in the EEPROM 10, a voltage of about 12V is applied to the fourth external terminal 80. The applied voltage is input to the voltage control terminal CG through a switching operation of the third transistor 40.

Further, in order to erase data from the EEPROM 10, a voltage of about 12V is applied to the second external terminal 60. The applied voltage is input to the voltage control terminal TG through a switching operation of the first transistor 20.

Further, in order to read data from the EEPROM 10, voltage of about 2V is applied to the third external terminal 70 and voltage of about 3.3V is applied to the fourth external terminal 80. The applied voltages 2V and 3.3V are input to the voltage control terminals RBL and CG through the second and third transistors 30 and 40, respectively.

However, the first and third transistors 20 and 40 cannot switch the voltage of 12V to the voltage control terminals TG and CG before receiving operating voltage of 12V or more through the first external terminal 50.

At this time, a threshold voltage $V_T$ exists in the first and third transistors 20 and 40. Thus, the operating voltage applied through the first external terminal 50 must be greater than "12V+$V_T$".

For this reason, the semiconductor device control circuit requires an additional voltage generator for supplying voltage of "12V+$V_T$" or more. This is often accomplished through a regulator or a voltage switch circuit using a clock signal.

FIG. 3 is a circuit diagram schematically illustrating elements of a voltage switch circuit according to a related art that may be connected with the semiconductor device control circuit of FIG. 1, and FIG. 4 is a graph illustrating signals of the voltage switch circuit of FIG. 3.

Referring to FIG. 3, the voltage switch circuit includes seven transistors a first transistor 125, a second transistor 130, a third transistor 135, a fourth transistor 140, a fifth transistor 145, a sixth transistor 146 and a seventh transistor 147. In addition, the voltage switch circuit includes four external terminals: a first external terminal 105, a second external terminal 120, a third external terminal 110, and a fourth external terminal 115.

The first external terminal 105 of the voltage switch circuit may be connected to the first external terminal 50 of the semiconductor device control circuit of FIG. 1. The fourth to seventh transistors 140, 145, 146 and 147 connect to the first external terminal 105 of the voltage switch circuit through a Zener diode 155.

The Zener diode 155 and the fourth to seventh transistors 140, 145, 146 and 147 constitute a circuit for generating the voltage of "12V+$V_T$" or more by boosting the input voltage.

The second external terminal 120 of the voltage switch circuit receives an enable signal. The second external terminal 120 connects to the source of first transistor 125. The drain of the first transistor 125 is connected between the first external terminal 105 and the Zener diode 155 at a node N1.

The node N1 is connected to the drain of the second transistor 130. The gate of the second transistor 130 is connected to the third external terminal 110 through a capacitor 150. The third external terminal 110 receives a clock signal.

The source of the second transistor 130 is connected to the source of the third transistor 135. The drain of the third transistor 135 is connected to the fourth external terminal 115 to which an operating voltage VPP is applied.

In addition, the gate of the second transistor 130 connects to the sources of both the third transistor 135 and the second transistor 130 at a node N2. Further, the gate of the third transistor 135 is connected to the node N1.

Hereinafter, an operation of the voltage switch circuit having the construction as described above will be briefly described.

First, if VSS (often a ground or 0V signal) is input through the second external terminal 120 as an enable signal, the first transistor 125, which receives the VSS through a conduction terminal (its source) and receives VDD through a control terminal (gate) thereof, is turned on. Thus, the VSS is transferred to the first external terminal 105 through the drain of the first transistor 125.

In such a case, the semiconductor device control circuit does not receive a voltage of "12V+$V_T$" or more.

Second, if the VDD voltage is input through the second external terminal 120, the first transistor 125 is turned off, and one terminal of the capacitor 150 continuously receives the VDD and the VSS voltage values according to a boosting clock signal input through the third external terminal 110.

Thus, voltage of the node N2 is boosted.

The voltage boosted in the node N2 is applied to the control terminal (gate) of the second transistor 130. Then, as the second transistor 130 operates (is on), high voltage current flows in the first external terminal 105.

The high voltage current is identical to the sum of breakdown voltage of the Zener diode 155 and threshold voltages of the fourth to seventh transistors 140, 145, 146 and 147. Thus, the voltage of "12V+$V_T$" or more can be supplied to the semiconductor device control circuit.

Referring to FIG. 4, the clock signal shown in graph "A" is input to the third external terminal 110. The graph "A" appears as a solid block between VSS and VDD voltage values because of the frequency of the clock signal. The VDD and VSS enable signal shown in graph "B" are periodically input through the second external terminal 120.

Referring to graph "C", if the VSS is input, low voltage is generated and transferred to the first external terminal 105. This corresponds to the first operation as described above.

In graph "C", when the VDD is input, the high voltage, i.e. the voltage of "12V+$V_T$" or more, is generated and transferred to the first external terminal 105. This corresponds to the second operation as described above.

Since the voltage switch circuit as described above requires a plurality of devices, the size and area of the circuit is increased and a limitation exists in the minimization of the chip size.

Further, since the current of high voltage generated in the voltage switch circuit is affected by the breakdown voltage of the Zener diode 155 and the threshold voltages of the transistors 140, 145, 146 and 147, controlling a voltage numerical value may be difficult. Furthermore, since the high voltage current is sensitive to peripheral conditions such as temperature, the voltage may not be stably generated.

BRIEF SUMMARY

Embodiments of the present invention provide a voltage switch circuit for a semiconductor device capable of minimizing a circuit size. According to an embodiment, the number of elements used in providing a voltage switching circuit can be reduced. Embodiments are capable of stably generating voltage regardless of the type and operation characteristics of a peripheral circuit. In addition, embodiments of the subject circuit can reduce the effects of environmental conditions, such as temperature.

A voltage switch circuit of a semiconductor device according to an embodiment can include five transistors and a capacitor. A clock signal entering through a first terminal can be connected to an output (fourth terminal) of the subject voltage switch through the capacitor. An enable signal can enter the subject voltage switch circuit through a third terminal. The enable signal affects a first transistor according to the first transistor's threshold voltage and directly controls the switching of a second transistor. A third transistor and fourth transistor are connected with a second terminal for receiving operating voltage. The third transistor is connected in series with the first transistor, and the fourth transistor is connected in series with the second transistor. The third transistor is controlled by/coupled to the output of the second and fourth transistor, and the fourth transistor is controlled by/coupled to the output of the first and third transistor, providing a coupling circuit. The switching of the fifth transistor allows the output of the coupling circuit to exit the fourth terminal. The fourth terminal outputs VSS when VDD is input to the third terminal, and outputs the boosted operating voltage when the VSS is input to the third terminal.

DETAILED DESCRIPTION

Hereinafter, a voltage switch circuit of a semiconductor device according to an embodiment will be described in detail with reference to the accompanying drawings. The voltage switch circuit of the semiconductor device according to the described embodiment can be used to provide voltage to the semiconductor device control circuit of FIG. 1.

Figure 5:
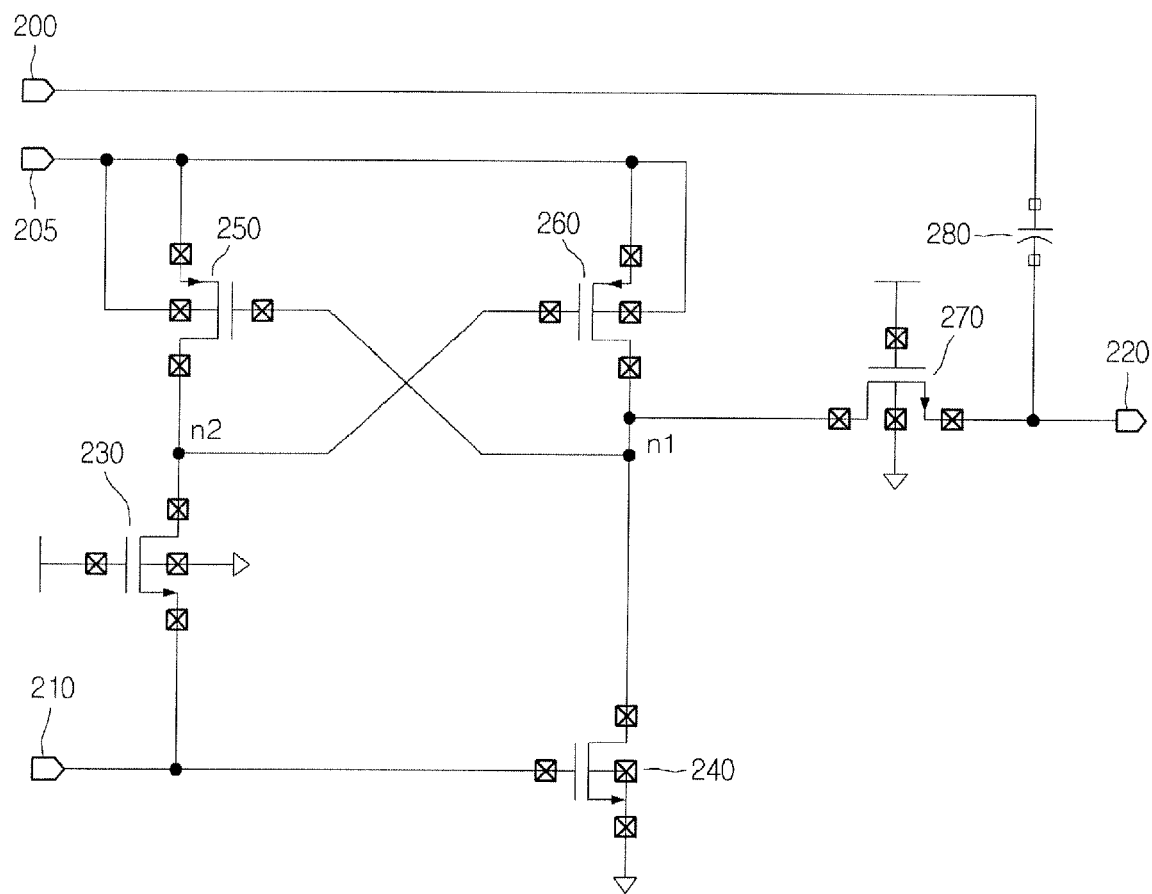
FIG. 5 is a circuit diagram schematically illustrating elements of a voltage switch circuit of a semiconductor device according to an embodiment.

FIG. 5 is a circuit diagram schematically illustrating elements of a voltage switch circuit of a semiconductor device according to an embodiment.

Referring to FIG. 5, the voltage switch circuit can include five transistors, a capacitor, and four terminals.

The first terminal 200 can receive a boosting clock signal, and the second terminal 205 can receive a high state voltage, such as, for example, an operating voltage of 12V.

Hereinafter, the voltage applied to the second terminal 205 will be referred to as "VPP".

The third terminal 210 can receive a low active enable signal, and the fourth terminal 220 can be connected with a semiconductor device control circuit to output the finally generated voltage of the subject voltage switch circuit.

When an enable signal in a low state is applied to the third terminal 210, the voltage switch circuit of the semiconductor device can output a high voltage, i.e., a voltage of "12V+$V_T$" or more. This represents circuit characteristics different to those of the conventional voltage switch circuit, and will be described in detail with reference to FIG. 6.

The third terminal 210 is connected with a first conduction terminal (e.g., source) of a first transistor 230 and a control terminal (e.g., gate) of a second transistor 240.

Further, a second conduction terminal (e.g., drain) of the first transistor 230 is connected with a first conduction terminal (e.g., drain) of a third transistor 250, and a second conduction terminal (e.g., drain) of the second transistor 240 is connected with a first conduction terminal (e.g., drain) of a fourth transistor 260.

The VDD is input to a control terminal (e.g., gate) of the first transistor 230.

A first conduction terminal (e.g., source) of the second transistor 240 is connected with a ground terminal.

The second terminal 205 is connected to a second conduction terminal (e.g., source) and a control terminal (e.g., gate) of the third transistor 250 and a second conduction terminal (e.g., source) of the fourth transistor 260.

The control terminal (e.g., gate) of the third transistor 250 is connected with the first conduction terminal (e.g., drain) of the fourth transistor 260, and the control terminal (e.g., gate) of the fourth transistor 260 is connected with the first conduction terminal (e.g., drain) of the third transistor 250. In particular, the third and fourth transistors 250 and 260 provide a coupling circuit.

The first conduction terminal (e.g., drain) of the fourth transistor 260 is connected with a first conduction terminal (e.g., drain) of the fifth transistor 270, and a second conduction terminal (e.g., source) of the fifth transistor 270 is connected with the fourth terminal 220.

The VDD can be input to a control terminal (e.g., gate) of the fifth transistor 270.

The first terminal 200 is connected to the second conduction terminal (e.g., source) of the fifth transistor 270 through a capacitor 280.

According to an embodiment, the first transistor 230, the second transistor 240 and the fifth transistor 270 are NMOS transistors, and the third transistor 250 and the fourth transistor 260 are PMOS transistors.

Hereinafter, for convenience of description, a branch point between the second transistor 240 and the fourth transistor 260 will be referred to as node n1 and a branch point between the first transistor 230 and the third transistor 250 will be referred to as node n2.

Hereinafter, an operation of the voltage switch circuit having the construction according to an embodiment will be described.

The voltage switch circuit according to the embodiment illustrated in FIG. 5 can output the voltage of "$12V+V_T$" or more or VSS according to operation conditions of the semiconductor device control circuit connected with the first terminal. Each case will be described.

First, the operation of the voltage switch circuit when the VSS is output will be described.

As the VDD voltage is input to the third terminal 210 and transfers to the control terminal (e.g., gate) of the second transistor 240, the second transistor 240 is turned on.

Thus, the VSS at the first conduction terminal (e.g., source) of the second transistor 240 is applied to node n1.

The VSS applied to node n1 input s to the control terminal (e.g., gate) of the third transistor 250, so that the third transistor 250 is turned on.

The VDD supplied from the second terminal 205 transfers to node n2 through the third transistor 250, and is input to the control terminal (e.g., gate) of the fourth transistor 260, so that the fourth transistor 260 is turned off.

Further, VDD is applied to the gate of the fifth transistor 270, so that the fifth transistor 270 is turned on. The VSS applied to the node n1 is transferred to the fourth terminal 220 via the fifth transistor 270.

Consequently, the semiconductor device control circuit connected with the fourth terminal 220 can receive VSS.

Second, the operation of the voltage switch circuit when the high voltage (i.e. the voltage of "$12V+V_T$" or more) is output will be described.

The VSS voltage is input to the third terminal 210 and transfers to the control terminal (e.g., gate) of the second transistor 240, so that the second transistor 240 is turned off.

The VSS is also input to the first conduction terminal (e.g., source) of the first transistor 230 through the third terminal 210, so that the first transistor 230 is turned on. Accordingly, the VSS is applied to node n2 through the first transistor 230.

The applied VSS is input to the control terminal (e.g., gate) of the fourth transistor 260 via the node n2, so that the fourth transistor 260 is turned on.

As the fourth transistor 260 is turned on, the VPP is applied to the node n1 through the fourth transistor 260.

The VPP applied to the node n1 is input to the control terminal (e.g., gate) of the third transistor 250, so that the third transistor 250 is turned off.

Since the fifth transistor 270 is turned on by receiving the VDD through the control terminal (e.g., gate) thereof, the VPP applied to the node n1 is transferred to the fourth terminal 220 through the fifth transistor 270.

During this time, a clock signal is input through the first terminal 200, and one terminal of the capacitor 280 continuously receives the VDD and VSS according to the input clock signal.

Thus, the VPP output through the second conduction terminal of the fifth transistor 270 is boosted on a line connected with one terminal of the capacitor 280.

In detail, the VPP is boosted through the switching operation according to the clock signal.

Figures 1, 2:
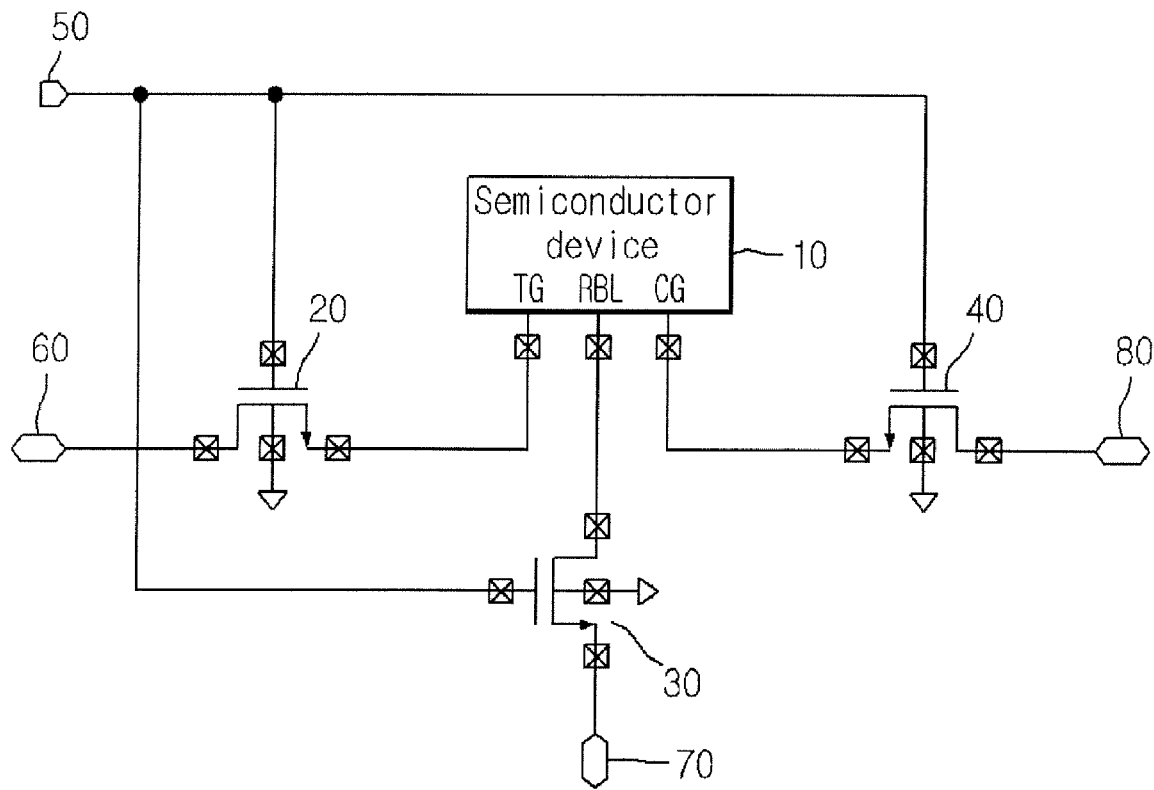
FIG. 1 is a circuit diagram schematically illustrating elements of a semiconductor device control circuit.
FIG. 2 is a data table illustrating voltage for each applied mode for controlling the semiconductor device of FIG. 1 according to a representative example.
Figure 3:
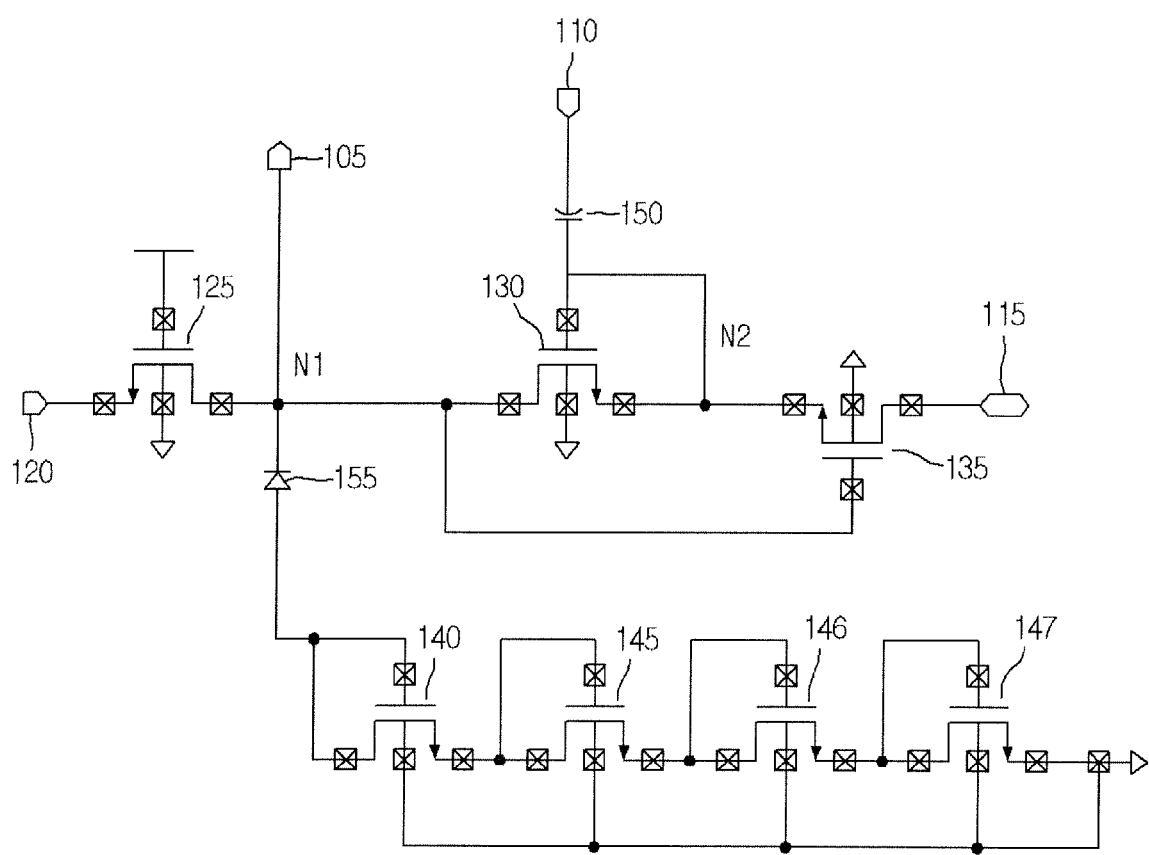
FIG. 3 is a circuit diagram schematically illustrating elements of a related art voltage switch circuit.
Figure 4:
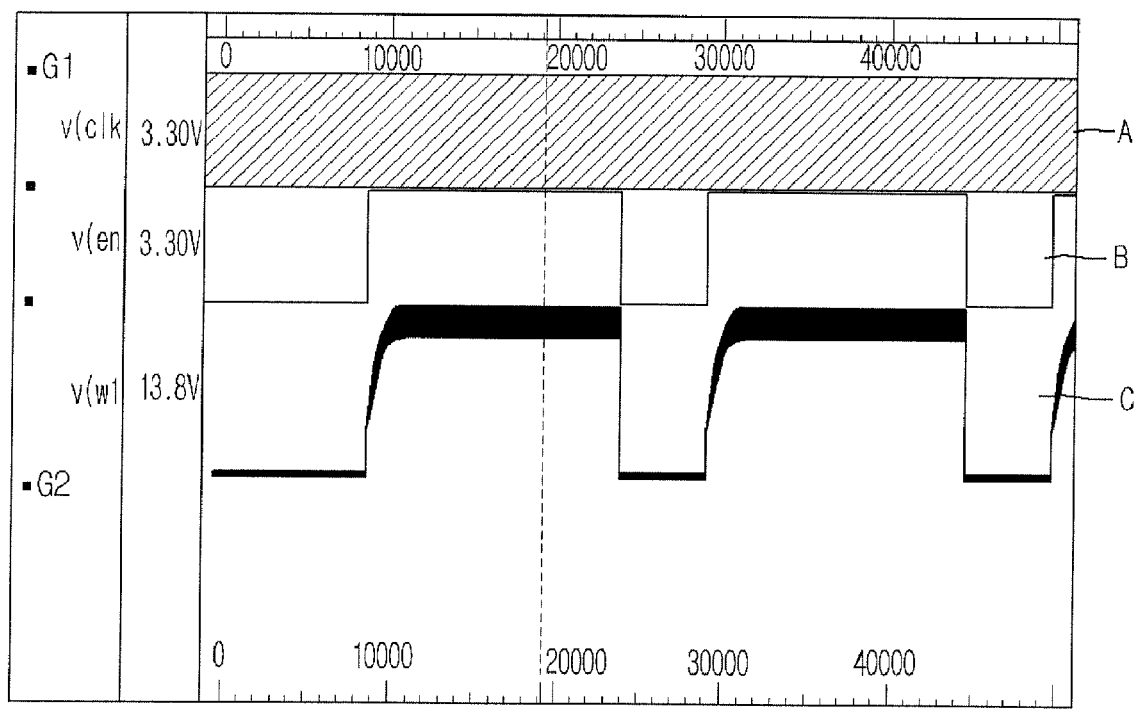
FIG. 4 is a graph illustrating signals of the voltage switch circuit of FIG. 3.

The VPP boosted as described above can be supplied as operating voltage for the semiconductor device control circuit through the fourth terminal, and can operate the transistors 20, 30 and 40 shown in FIG. 1 as the voltage of "$12V+V_T$" or more.

Figure 6:
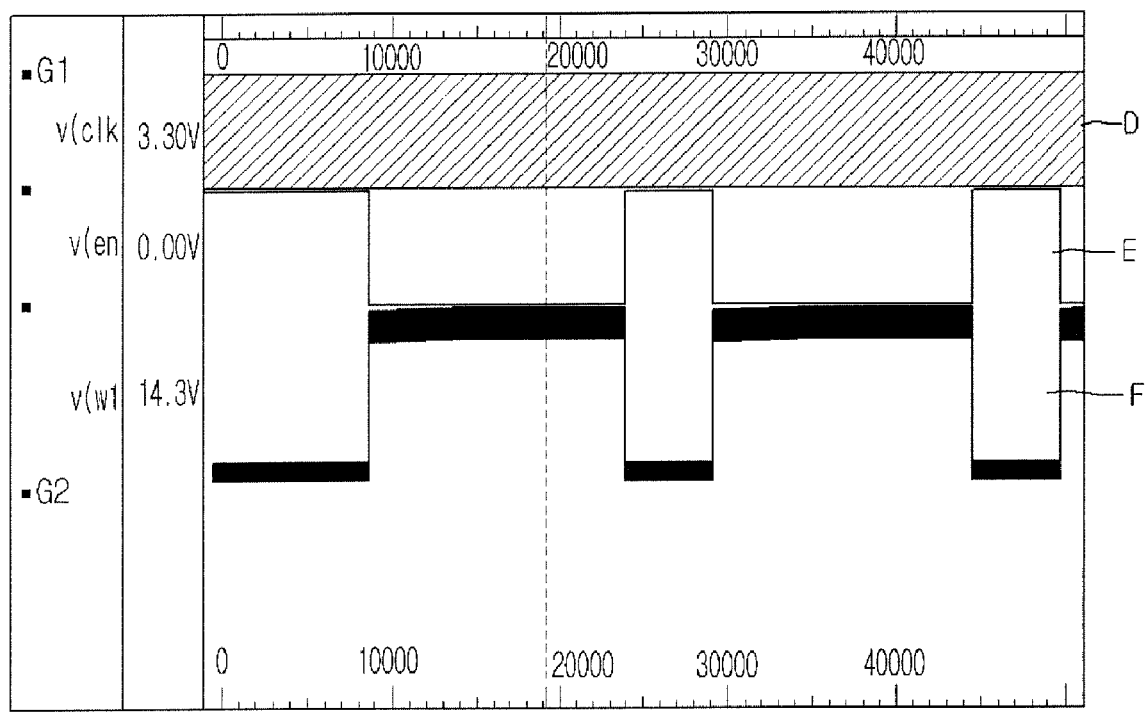
FIG. 6 is a graph illustrating signals of the voltage switch circuit of FIG. 5 according to an embodiment.

FIG. 6 is a graph illustrating signals of the voltage switch circuit of the semiconductor device according to the described embodiment.

Referring to FIG. 6, the clock signal indicated in the graph "D" is input to the first terminal 200 such that a signal of the capacitor 280 is switched. The graph "D" appears as a solid block because of the frequency of the clock signal.

Referring to the graph "E", the VDD and the VSS, which serve as the enable signals, are periodically input through the third terminal 210. This represents that the operation of the first circuit and the operation of the second circuit are alternatively performed.

Referring to the graph "F", when the enable signal is in a low state, i.e. when the VSS is input, the high voltage, i.e. the voltage of "$12V+V_T$" or more is output from the voltage switch circuit of the semiconductor device according to the embodiment.

However, when the enable signal is in a high state, i.e. when the VDD is input, the VSS is output from the voltage switch circuit of the semiconductor device according to the embodiment.

According to an embodiment, the voltage switch circuit of the semiconductor device can be achieved using a minimum number of elements, so that the chip size can be reduced. Further, the voltage switch circuit can be integrated with other circuits in the form of an SOC (system on chip).

Further, in achieving the voltage switch circuit of the semiconductor device, the number of parts and the manufacturing process can be simplified, so that the production cost and time can be saved.

In addition, a conventional structure of boosting voltage using breakdown voltage of a diode and threshold voltage of a transistor can be omitted, so that output characteristics of the voltage switch circuit can be inhibited from being changed due to the type and operation characteristics of a peripheral circuit, and temperature.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A voltage switch circuit of a semiconductor device, the voltage switch circuit comprising:
a first transistor and a second transistor coupled to a third terminal, wherein the third terminal receives an enable signal;
a third transistor and a fourth transistor coupled to a second terminal, wherein the second terminal receives an operating voltage,
wherein the first transistor is connected in series with the third transistor through a second node and the second transistor is connected in series with the fourth transistor through a first node, wherein the third transistor connects to the first node and the fourth transistor connects to the second node to provide a coupling circuit;
a fifth transistor connected in series between the first node and a fourth terminal, wherein the fourth terminal provides an output voltage; and
a capacitor connected at a first end to a first terminal and at a second end to the fourth terminal in parallel with the fifth transistor, wherein the first terminal receives a clock signal;
wherein the fourth terminal outputs a VSS voltage when a VDD voltage is input to the third terminal, and outputs a boosted operating voltage when the VSS voltage is input to the third terminal.

2. The voltage switch circuit according to claim 1, wherein the first transistor is coupled to the third terminal through a first conduction terminal of the first transistor, and wherein the second transistor is coupled to the third terminal couples through a control terminal of the second transistor.

3. The voltage switch circuit according to claim 2, wherein VDD is applied to a control terminal of the first transistor, and wherein VSS is applied to a first conduction terminal of the second transistor.

4. The voltage switch circuit according to claim 3, wherein the first transistor and the second transistor comprise NMOS transistors, wherein the first conduction terminal of the first transistor is the source of the first transistor and the control terminal of the first transistor is the gate of the first transistor, and wherein the first conduction terminal of the second transistor is the source of the second transistor and the control terminal of the second transistor is the gate of the second transistor.

5. The voltage switch circuit according to claim 1, wherein the third transistor is coupled to the second terminal at a first conduction terminal of the third transistor, and wherein the first transistor is connected in series with the third transistor using a second conduction terminal of the third transistor and a second conduction terminal of the first transistor.

6. The voltage switch circuit according to claim 1, wherein the fourth transistor is coupled to the second terminal at a first conduction terminal of the fourth transistor, and wherein the second transistor is connected in series with the fourth transistor using a second conduction terminal of the fourth transistor and a second conduction terminal of the second transistor.

7. The voltage switch circuit according to claim 1, wherein a control terminal of the third transistor is connected to the first node, and a control terminal of the fourth transistor is connected to the second node to provide the coupling circuit.

8. The voltage switch circuit according to claim 7, wherein the third transistor and the fourth transistor comprise PMOS transistors, wherein the control terminal of the third transistor is the gate of the third transistor and the control terminal of the fourth transistor is the gate of the fourth transistor.

9. The voltage switch circuit according to claim 1, wherein the fifth transistor comprises:
a first conduction terminal connected to the first node,
a second conduction terminal connected to the fourth terminal, and
a control terminal for receiving an applied VDD voltage.

10. The voltage switch circuit according to claim 9, wherein the fifth transistor comprises an NMOS transistor.

11. The voltage switch circuit according to claim 1, wherein the fourth terminal provides the output voltage to a semiconductor device control circuit, and wherein the operating voltage received by the second terminal comprises an operating voltage for the semiconductor device control circuit.

12. The voltage switch circuit according to claim 11, wherein the boosted operating voltage is greater than a numerical value obtained by adding the operating voltage of the semiconductor device control circuit to threshold voltage of a transistor of the semiconductor device control circuit.

13. The voltage switch circuit according to claim 12, wherein the semiconductor device control circuit controls writing, reading and erasing operations of a memory device.

14. The voltage switch circuit according to claim 1, wherein the first, second and fifth transistors are NMOS transistors, and the third and fourth transistors are PMOS transistors.

15. The voltage switch circuit according to claim 1, wherein the capacitor continuously receives alternating VDD and VSS from the clock signal input through the first terminal, such that the capacitor boosts voltage at the fourth terminal.

* * * * *